(12) United States Patent
Tanji

(10) Patent No.: US 7,012,253 B2
(45) Date of Patent: Mar. 14, 2006

(54) TRANSMISSION ELECTRON MICROSCOPE AND THREE-DIMENSIONAL OBSERVING METHOD

(75) Inventor: Takayoshi Tanji, Nagoya (JP)

(73) Assignee: Nagoya University, Nagoya (JP)

( * ) Notice: Subject to any disclaimer, the term of this patent is extended or adjusted under 35 U.S.C. 154(b) by 122 days.

(21) Appl. No.: 10/713,109

(22) Filed: Nov. 17, 2003

(65) Prior Publication Data
US 2004/0144923 A1    Jul. 29, 2004

(30) Foreign Application Priority Data
Nov. 20, 2002  (JP) ............................... 2002-336392

(51) Int. Cl.
G21K 7/00        (2006.01)
G01N 23/00     (2006.01)

(52) U.S. Cl. ...................................... 250/311; 250/310
(58) Field of Classification Search ................ 250/310, 250/311
See application file for complete search history.

(56) References Cited

U.S. PATENT DOCUMENTS 4,097,739 A * 6/1978 Muller et al. ................ 250/311
5,576,543 A * 11/1996 Dingley ....................... 250/311

FOREIGN PATENT DOCUMENTS

| JP | B 49-22576 | 6/1974 |
| JP | A 1-264151 | 10/1989 |
| JP | A 3-246861 | 11/1991 |

* cited by examiner

*Primary Examiner*—John R. Lee
*Assistant Examiner*—David A. Vanore
(74) *Attorney, Agent, or Firm*—Oliff & Berridge, PLC

(57) ABSTRACT

An electron beam is emitted from an electron beam source, and deflected at different directions with a deflection plate to form a first electron beam E1 and a second electron beam E2. The first electron beam E1 is incident onto a given portion of a sample at an angle of θ1, and the second electron beam E2 is incident onto the same portion of the sample at an angle of θ2. A first image and a second image of the portion of the sample by the first electron beam E1 and the second electron beam E2 are combined at a three-dimensional displaying device to display the portion of the sample three-dimensionally.

12 Claims, 4 Drawing Sheets

TRANSMISSION ELECTRON MICROSCOPE AND THREE-DIMENSIONAL OBSERVING METHOD

BACKGROUND OF THE INVENTION

1. Field of the Invention

This invention relates to a transmission electron microscope and a three-dimensional observing method.

2. Description of the Prior Art

Conventionally, a CT method or a stereographic projection method were available as a three-dimensional observing method using a transmission electron microscope (TEM). With the CT method, the projection images of a given portion of a sample are photographed within a predetermined range of observation angle while the sample is rotated by 0 degree to 180 degrees, and processed in image to obtain a three-dimensional structure of the portion of the sample as a three-dimensional observation. With the stereographic projection method, two images of a sample are photographed at different angles by a parallactic angle while the sample is rotated, and observed three-dimensionally by means of stereo viewer after development and exposure.

With the CT method, however, it takes long time to perform the image processing, so that the change of the sample can not be observed in real-time. With the stereographic method, the development and exposure of the images are required in addition to the rotation of the sample, so that it takes several ten minutes to perform the entire process and the change of the sample can not be also observed in real-time.

SUMMARY OF THE INVENTION

It is an object of the present invention to provide a new transmission electron microscope which can realize a real-time observation for a sample and a three-dimensional observing method using the transmission electron microscope.

In order to achieve the above object, this invention relates to a transmission electron microscope comprising:

an electron beam source, a deflector which is provided in front of the electron beam source and deflects an electron beam from the electron beam source in different directions to form a first electron beam and a second electron beam, which are incident onto a given portion of a sample by different angles, and a three-dimensional displaying device which combines a first image by the first electron beam and a second image by the second electron beam and displays the portion of the sample three-dimensionally.

This invention also relates to a three-dimensional observing method comprising the steps of:

emitting an electron beam from an electron beam source, deflecting the electron beam by a deflector provided in front of the electron beam source to form a first electron beam and a second electron beam which are incident onto a given portion of a sample at different angles, and combining a first image and a second image of the portion of the sample by the first electron beam and the second electron beam to display an image of the portion of the sample three-dimensionally.

The inventor had intensely studied to achieve the above object. As a result, the inventor found out the following fact of the matter. An electron beam from a given electron beam source is deflected to generate two kinds of electron beams, which are incident onto the same portion of a sample at different angles to generate two kinds of images from the two electron beams deflected. Then, if the two images are combined, the portion of the sample can be observed three-dimensionally. That is, since the two electron beams are incident into the same portion of the sample, the two images correspond to two images which are different in a parallactic angle depending on the different incident angles. Therefore, if the two images are combined to be projected on a three-dimensional image displaying device, the portion of the sample can be observed three-dimensionally. As a result, the sample can be observed three-dimensionally.

In the present invention, since the complicated image processing as in the CT method and additional development and exposure operations as in the stereographic projection method are not required, the tact time in observation of the sample depends on the time interval in incidence between the first deflected electron beam and the second deflected electron beam for the sample. The incident time interval can be reduced without limit, and if synchronized with a given external signal, can be reduced easily to the order of centisecond. Therefore, the sample can be observed three-dimensionally in real-time.

In a preferred embodiment, the deflector includes a deflection plate, and the two electron beams to be incident onto the same portion of the sample are generated by switching the polarity of voltage to be applied to the deflection plate and deflecting the electron beam from the electron beam source. In this case, the two electron beams can be easily generated. Therefore, the sample can be easily observed three-dimensionally.

In another preferred embodiment, the deflector includes an electron beam trapezoidal prism composed of a pair of filaments and a pair of earth electrodes provided in the outside of the filaments. In this case, when the polarity of voltage to be applied to the filaments is switched, the electron beam from the electron beam source is deflected at different directions to generate the two electron beams to be incident onto the same portion of the sample. Therefore, the two electron beams can be easily generated and thus, the sample can be easily observed three-dimensionally.

If an image combiner is provided in front of the electron beam source and the electron beam trapezoidal prism, a first hologram and a second hologram can be provided. The first hologram is made by the superimposition between a first image from the first electron beam and a third image beam from a third electron beam not through the sample. The second hologram is made by the superimposition between a second image from the second electron beam and the third image from the third electron beam. In this case, if reproduced images from the first image and the second image obtained from the holograms by separation are displayed on the three-dimensional image displaying device, the portion of the sample to be observed can be easily observed. As a result, the sample can be easily observed three-dimensionally.

Herein, the "electron beam trapezoidal prism" is called for convenience because the electric potential distribution between the filaments and the earth electrodes provided in the outside of the filaments forms a trapezoidal shape.

BRIEF DESCRIPTION OF THE DRAWINGS

For better understanding of the present invention, reference is made to the attached drawings, wherein.

DESCRIPTION OF THE PREFERRED EMBODIMENTS

Figure 1:
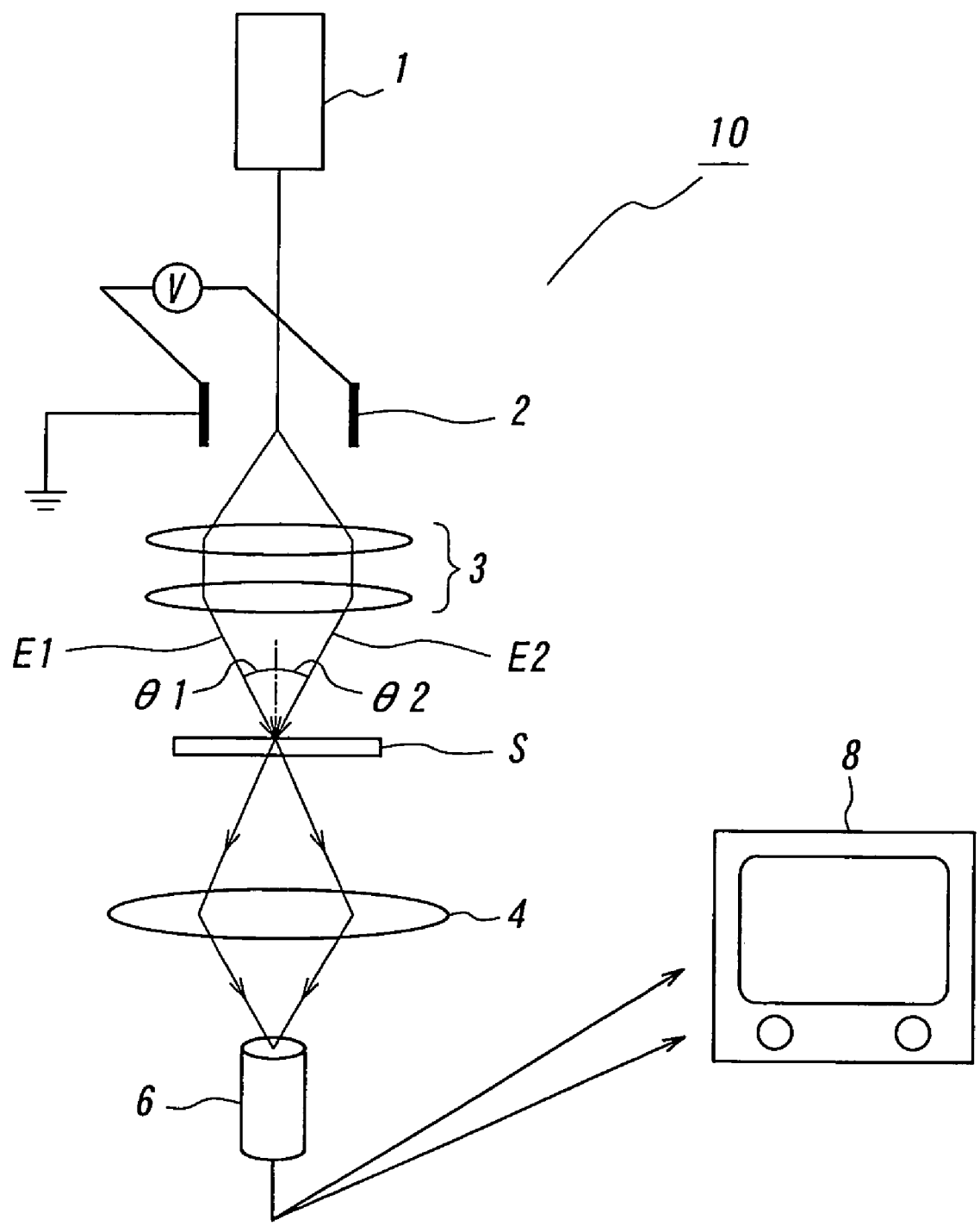
FIG. 1 is a structural view schematically showing a transmission electron microscope according to the present invention.

This invention will be described in detail with reference to the accompanying drawings. FIG. 1 is a structural view schematically showing a transmission electron microscope according to the present invention. The transmission electron microscope (TEM) 10 illustrated in FIG. 1 includes an electron beam source 1, a deflection plate 2, an irradiation lens 3, a focusing lens 4 and an imaging device 6 which are provided in front of the electron beam source 1. The imaging device 6 is connected to a stereo displaying monitor 8. A sample "S" to be observed is disposed in between the irradiation lens 3 and the focusing lens 4.

An electron beam from the electron beam source 1 is deflected in the left direction by applying a given voltage to the deflection plate 2 when the electron beam is passed through the deflection plate 2 to form a first electron beam E1, which is incident onto a given portion of the sample S by an angle of θ1. Then, the polarity of the voltage to be applied to the deflection plate 2 is switched to deflect the electron beam from the electron beam source 1 in the right direction and to form a second electron beam E2, which is incident onto the portion of the sample S by an angle of θ2.

The first electron beam E1 and the second electron beam E2 are passed through the sample S. A first image of the sample S by the first electron beam E1 and a second image of the sample S by the second electron beam E2 are incident to and passed through the focusing lens 4, and incident into the imaging device 6. Then, electric signals corresponding to the first image and the second image are transmitted to the stereo displaying monitor 8, where the first image and the second image are combined to generate a three-dimensional image of the portion of the sample S with the first electron beam E1 and the second electron beam E2 being incident. As a result, the sample can be observed three-dimensionally.

In the TEM 10 illustrated in FIG. 1, the tact time in observation of the sample S depends on the time interval in incidence between the first electron beam E1 and the second electron beam E2 for the sample S, and more, corresponds to the switching interval of the polarity of voltage for the deflation plate 2. Therefore, if the switching interval is synchronized with an external signal, it can be reduced extremely short, for example up to the order of centisecond. As a result, the sample S can be observed in real-time.

Concretely, the switching interval can be synchronized with an operation signal for the imaging device 6. In this case, the first image by the first electron beam E1 and the second image by the second electron beam E2 can be easily introduced into the imaging device 6 at every frame. Therefore, the introduction of the first image and the second image in the same frame at the same time can be prevented, and the non-introduction of the first image or the second image in a given frame can be prevented, so that the sample can be precisely observed three-dimensionally.

The incident angle θ1 of the first electron beam E1 for the sample S is preferably set within a range of one to five degrees from a normal line of the sample S. The incident angle θ2 of the second electron beam E2 for the sample S is preferably set within a range of one to five degrees from the normal line of the sample S. In this case, the three-dimensional image of the portion of the sample S can be precisely obtained and as a result, the sample S can be precisely observed three-dimensionally.

Figure 2:
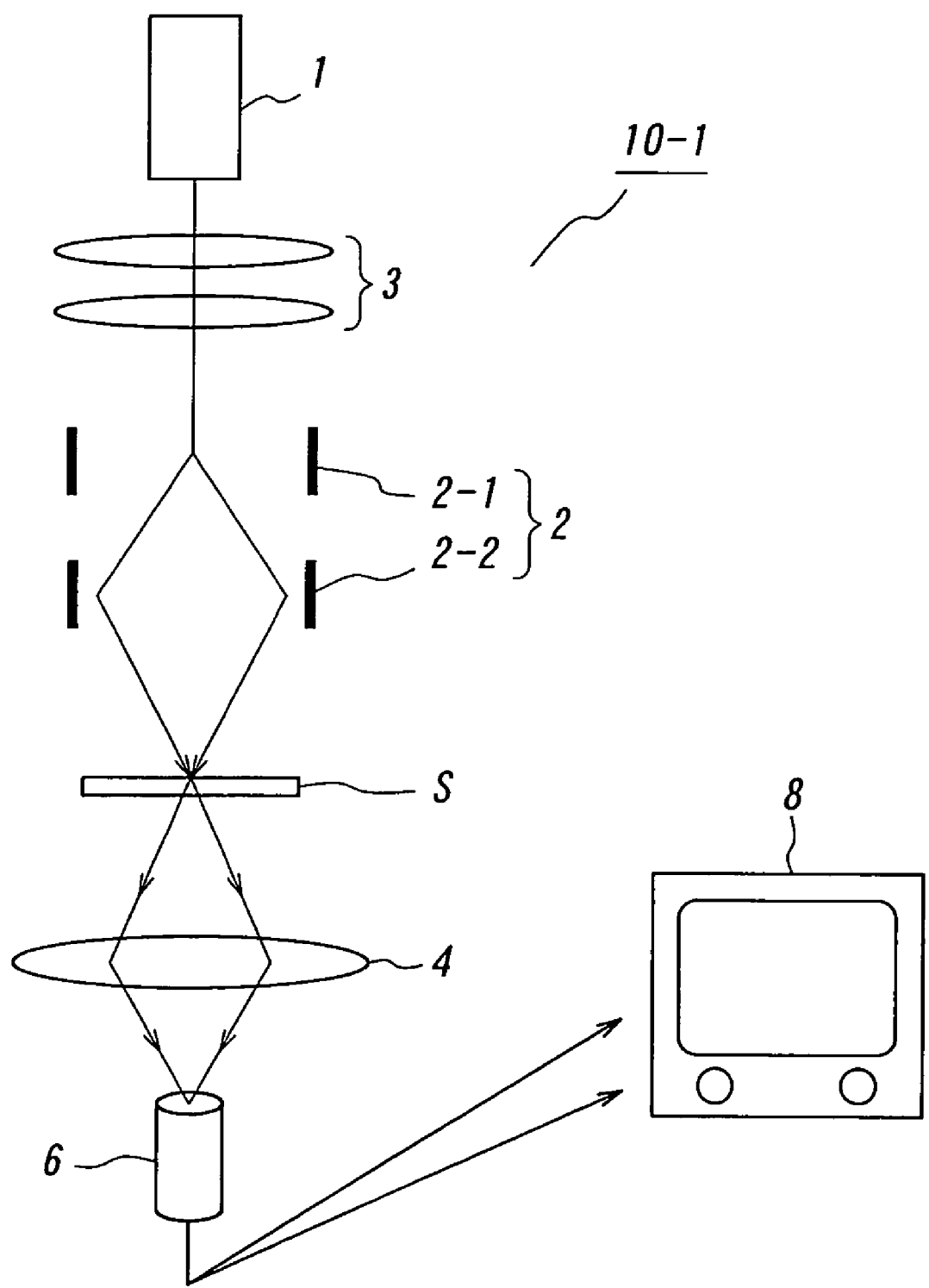
FIG. 2 is a structural view schematically showing another transmission electron microscope which is modified from the one in FIG. 1.

FIG. 2 is a structural view schematically showing another transmission electron microscope which is modified from the one in FIG. 1. Although in the TEM 10 illustrated in FIG. 1, the irradiation lens 3 is disposed in between the deflection plate 2 and the sample S, in the TEM 10-1 illustrated in FIG. 2, the irradiation lens 3 is disposed in between the electron beam source 1 and the deflection plate 2.

As is apparent from FIGS. 1 and 2, the electron beam from the electron beam source 1 is deflected by only the single deflection plate 2 when the irradiation lens 3 is disposed in between the deflection plate 2 and the sample S, but by the two deflection plates 2-1 and 2-2 when the irradiation lens 3 is disposed in between the electron beam source 1 and the deflection plate 2. In view of simplification, the TEM 10 is desired.

Figure 3:
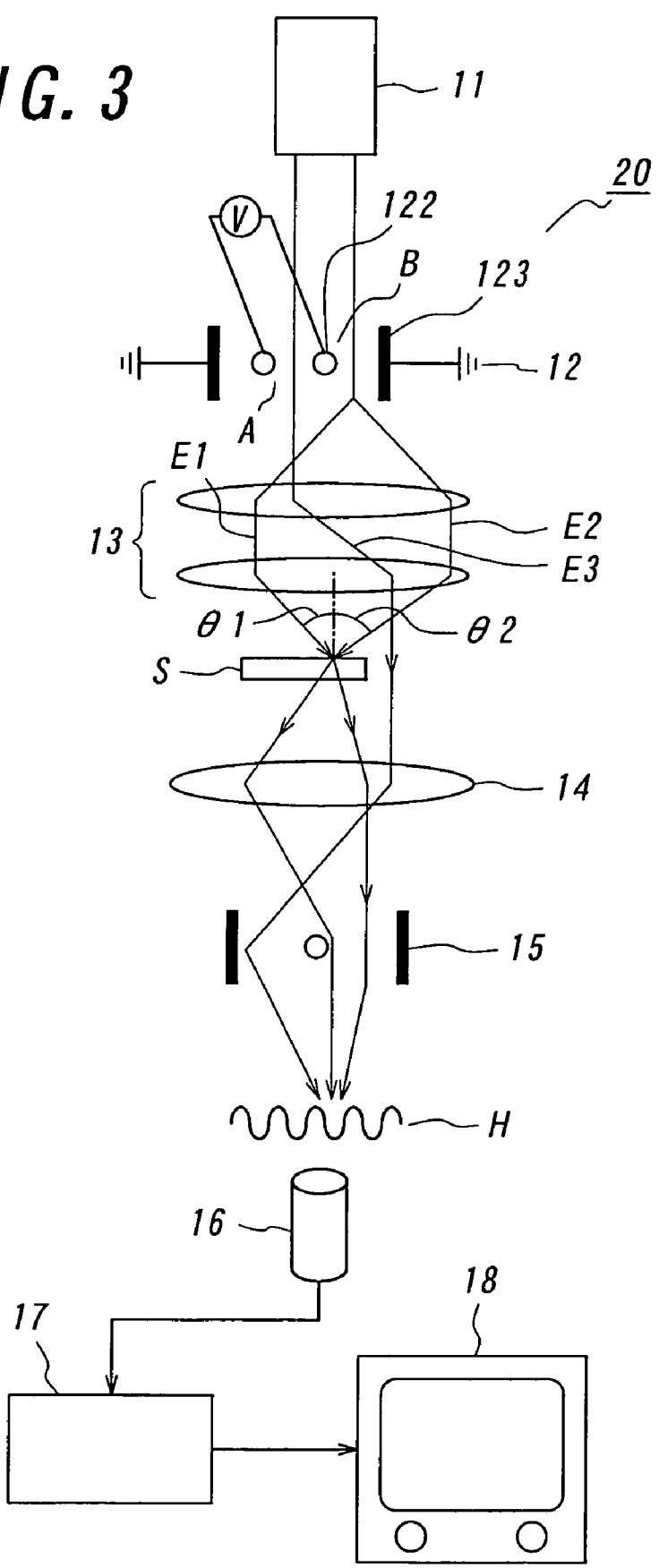
FIG. 3 is a structural view schematically showing still another transmission electron microscope according to the present invention.

FIG. 3 is a structural view schematically showing still another transmission electron microscope according to the present invention. The TEM 20 illustrated in FIG. 3 includes an electron beam source 11, an electron beam trapezoidal prism 12, an irradiation lens 13, a focusing lens 14, an electron beam biprism 15 and an imaging device 16 which are provided in front of the electron beam source 11. The imaging device 16 is connected to a stereo displaying monitor 18 via a separative and regenerative circuit 17. A sample "S" to be observed is disposed in between the irradiation lens 13 and the focusing lens 14. The focusing lens 14 and the electron beam biprism 15 constitute a focusing lens system.

Figure 4:
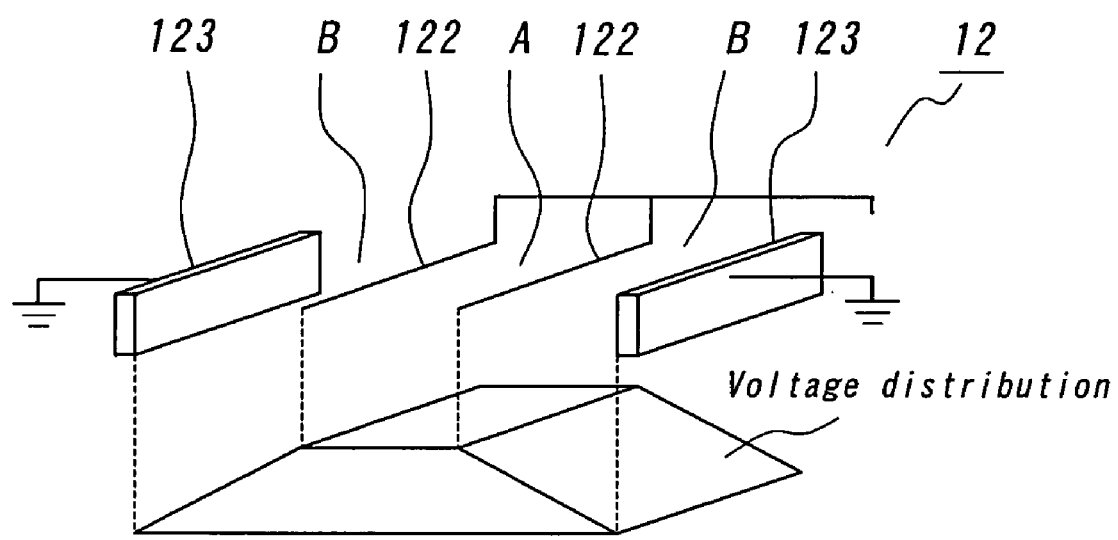
FIG. 4 is a structural view schematically showing an electron beam trapezoidal prism in the transmission electron microscope of the present invention.

FIG. 4 is a structural view schematically showing the electron beam trapezoidal prism 12. As illustrated in FIG. 4, the electron beam trapezoidal prism 12 includes a pair of filaments 122 and a pair of earth electrodes 123 provided in the outside of the filaments 122. In this case, a trapezoidal electric potential distribution is formed by the filaments 122 and the earth electrodes 123. With the electron beam trapezoidal prism 12, therefore, an electron beam is not deflected when passed through the region A in between the filaments 122, and deflected by an electric field when passed through the regions B in between the filaments 122 and the earth electrodes 123.

In this embodiment, an electron beam from the electron beam source 11 is deflected in the left direction by an electric field generated in between the filaments 122 and the earth electrodes 123 when passing through the regions B of the electron beam trapezoidal prism 12 to form a first electron beam E1, which is incident onto a given portion of the sample S by an angle of θ1. Then, the polarity of the voltage to be applied to the filaments 122 and the earth electrodes 123 is switched to deflect the electron beam from the electron beam source 11 in the right direction when passing through the regions B of the electron beam trapezoidal prism 12 to form a second electron beam E2, which is incident onto the portion of the sample S by an angle of θ2.

The first electron beam E1 and the second electron beam E2 are passed through the sample S. A first image of the sample S by the first electron beam E1 and a second image of the sample S by the second electron beam E2 are incident to and passed through the focusing lens 14, and incident into the electron beam biprism 15. On the other hand, a third electron beam E3 from the electron beam source 11 is incident into the electron beam biprism 15 via the focusing lens 14, not through the sample S. The first and the second images are superimposed as object waves with the third electron beam E3 as a reference wave to form electron beam holograms "H".

The holograms H are photographed at the imaging device 16, and separated in the separative and regenerative circuit 17. The resultant separated and regenerated first and second images are introduced into the stereo displaying monitor 18, and the portion of the sample S with the first electron beam and the second electron beam being incident is displayed three-dimensionally at the monitor 18. As a result, the sample S can be observed three-dimensionally.

In the TEM 20 illustrated in FIG. 3, the tact time in observation of the sample S depends on the time interval in incidence between the first electron beam E1 and the second electron beam E2 for the sample S, and more, corresponds to the switching interval of the polarity of voltage for the filaments 122 and the earth electrodes 123 of the electron beam trapezoidal prism 12. Therefore, if the switching interval is synchronized with an external signal, it can be reduced extremely short, for example up to the order of centisecond. As a result, the sample S can be observed in real-time.

Concretely, the switching interval can be synchronized with an operation signal for the imaging device 6, so that the above-mentioned effect in the first embodiment relating to FIG. 1 can be provided.

With the TEM 20 illustrated in FIG. 3, however, the electron beam holograms H can be obtained when the voltage polarity of the electron beam trapezoidal prism 12 is not switched in synchronization with the external signal, so that the sample S can be observed three-dimensionally without the synchronizing operation.

The incident angle θ1 of the first electron beam E1 for the sample S is preferably set within a range of one to five degrees from a normal line of the sample S. The incident angle θ2 of the second electron beam E2 for the sample S is preferably set within a range of one to five degrees from the normal line of the sample S. In this case, the three-dimensional image of the portion of the sample S can be precisely obtained and as a result, the sample S can be precisely observed three-dimensionally.

Although the present invention was described in detail with reference to the above examples, this invention is not limited to the above disclosure and every kind of variation and modification may be made without departing from the scope of the present invention.

As mentioned above, according to the present invention, a new apparatus and a new method whereby a laser beam of high intensity can be obtained through the condensation of a pulsed laser without a complicated optical system can be provided.

What is claimed is:

1. A transmission electron microscope comprising:
    an electron beam source,
    a deflector which is provided in front of said electron beam source and deflects an electron beam from said electron beam source in different directions to form a first electron beam and a second electron beam, which are incident onto a given portion of a sample by different angles, and
    a three-dimensional displaying device which combines a first image by said first electron beam and a second image by said second electron beam and displays said portion of said sample three-dimensionally,
    wherein said deflector comprises an electron beam trapezoidal prism composed of a pair of filaments and a pair of earth electrodes provided in an outside of said filaments.

2. The transmission electron microscope as defined in claim 1, wherein said first electron beam is incident onto said sample by an angle within a range of one to five degrees in a right side from a normal line of said sample, and said second electron beam is incident onto said sample by an angle within a range of one to five degrees in a left side from said normal line of said sample.

3. The transmission electron microscope as defined in claim 1, further comprising an image combiner which is provided in front of said electron beam source and said electron beam trapezoidal prism, and forms a first electron beam hologram from said first image by said first electron beam and a third image by a third electron beam not through said sample and a second electron beam hologram from said second image by said second electron beam and said third image by said third electron beam.

4. The transmission electron microscope as defined in claim 3, further comprising an imaging device which is provided in front of said image combiner and photographs said first electron beam hologram and said second electron beam hologram.

5. The transmission electron microscope as defined in claim 4, wherein irradiation times of said first electron beam and said second electron beam for said sample are synchronized with an operation signal of said imaging device.

6. The transmission electron microscope as defined in claim 3, further comprising a separative and regenerative circuit for separating and regenerating said first electron beam hologram and said second electron beam hologram.

7. A three-dimensional observing method comprising the steps of:
    emitting an electron beam from an electron beam source,
    deflecting said electron beam by a deflector provided in front of said electron beam source to form a first electron beam and a second electron beam which are incident onto a given portion of a sample at different angles, and
    combining a first image and a second image of said portion of said sample by said first electron beam and said second electron beam to display an image of said portion of said sample three-dimensionally,
    wherein said deflector comprises an electron beam trapezoidal prism composed of a pair of filaments and a pair of earth electrodes provided in an outside of said filaments, whereby said first electron beam and said second electron beam are formed by switching a polarity of voltage to be applied to said filaments.

8. The three-dimensional observing method as defined in claim 7, wherein said first electron beam is incident onto said sample by an angle within a range of one to five degrees in a right side from a normal line of said sample, and said second electron beam is incident onto said sample by an angle within a range of one to five degrees in a left side from said normal line of said sample.

9. The three-dimensional observing method as defined in claim 7, further comprising the step of forming, with an image combiner provided in front of said electron beam source and said electron beam trapezoidal prism, a first electron beam hologram from said first image by said first electron beam and a third image by a third electron beam not through said sample and a second electron beam hologram from said second image by said second electron beam and said third image by said third electron beam.

10. The three-dimensional observing method as defined in claim 9, further comprising the step of photographing said first electron beam hologram and said second electron beam hologram with an imaging device provided in front of said image combiner.

11. The three-dimensional observing method as defined in claim 10, further comprising the step of synchronizing irradiation times of said first electron beam and said second electron beam for said sample with an operation signal of said imaging device.

12. The three-dimensional observing method as defined in claim 9, wherein said first electron beam hologram and said second electron beam hologram are separated and regenerated with a separative and regenerative circuit, and displayed three-dimensionally at said three-dimensional displaying device.

* * * * *